United States Patent
Chieu et al.

(10) Patent No.: US 7,836,314 B2
(45) Date of Patent: Nov. 16, 2010

(54) COMPUTER SYSTEM PERFORMANCE ESTIMATOR AND LAYOUT CONFIGURATOR

(75) Inventors: Trieu C. Chieu, Scarsdale, NY (US);
Hoi Y. Chan, New Canaan, CT (US);
Vinod Kamath, Raleigh, NC (US);
Lawrence S. Mok, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 1044 days.

(21) Appl. No.: 11/506,876

(22) Filed: Aug. 21, 2006

(65) Prior Publication Data

US 2008/0046766 A1 Feb. 21, 2008

(51) Int. Cl.
*G06F 1/00* (2006.01)
(52) U.S. Cl. .................................. 713/300
(58) Field of Classification Search ............ 713/300; 700/28, 90
See application file for complete search history.

(56) References Cited

U.S. PATENT DOCUMENTS

| | | | |
|---|---|---|---|
| 5,818,448 A | 10/1998 | Katiyar | |
| 5,835,384 A | 11/1998 | Lin | |
| 5,923,850 A | 7/1999 | Barroux | |
| 6,070,190 A | 5/2000 | Reps et al. | |
| 6,108,800 A | 8/2000 | Asawa | |
| 6,697,969 B1 | 2/2004 | Merriam | |
| 6,804,632 B2 * | 10/2004 | Orenstien et al. | 702/188 |
| 6,859,831 B1 | 2/2005 | Gelvin et al. | |
| 6,877,034 B1 | 4/2005 | Machin et al. | |
| 6,959,265 B1 | 10/2005 | Candela et al. | |
| 7,032,016 B2 | 4/2006 | Cerami et al. | |
| 7,127,625 B2 * | 10/2006 | Farkas et al. | 713/320 |
| 7,159,151 B2 | 1/2007 | Morgan et al. | |
| 7,313,503 B2 * | 12/2007 | Nakagawa et al. | 703/1 |
| 7,412,614 B2 * | 8/2008 | Ku | 713/321 |
| 2002/0052774 A1 | 5/2002 | Parker et al. | |
| 2002/0143606 A1 | 10/2002 | Atefi et al. | |
| 2002/0184082 A1 | 12/2002 | Nakano et al. | |
| 2003/0046339 A1 * | 3/2003 | Ip | 709/203 |
| 2003/0163380 A1 | 8/2003 | Vaccarelli et al. | |
| 2003/0182135 A1 | 9/2003 | Sone | |
| 2003/0200308 A1 | 10/2003 | Tameda et al. | |
| 2004/0044563 A1 | 3/2004 | Stein | |
| 2004/0088405 A1 | 5/2004 | Aggarwal | |
| 2004/0143478 A1 | 7/2004 | Ward | |
| 2004/0230438 A1 | 11/2004 | Pasquale et al. | |

(Continued)

OTHER PUBLICATIONS

Dodd, S. L., et al., "An Iterative Method for the Exact Solution of Coxian Queueing Networks", Proceedings of the 1981 ACM SIGMETRICS conference on Measurement and modeling of computer systems, 1981, pp. 97-104.

(Continued)

*Primary Examiner*—Thomas Lee
*Assistant Examiner*—Brandon Kinsey
(74) *Attorney, Agent, or Firm*—Cahn & Samuels LLP

(57) ABSTRACT

A method, system and computer readable medium for maximizing the performance of a computer system that includes at least one computing unit. Temperature and location data for each computing unit is received by a server unit and the location of each computing unit within a given environment is reevaluated and revised to maximize the overall performance of the computer system.

16 Claims, 5 Drawing Sheets

U.S. PATENT DOCUMENTS

| | | | |
|---|---|---|---|
| 2005/0027727 A1 | 2/2005 | Garcea et al. | |
| 2005/0049729 A1* | 3/2005 | Culbert et al. | 700/50 |
| 2005/0216775 A1* | 9/2005 | Inoue | 713/300 |
| 2007/0067136 A1* | 3/2007 | Conroy et al. | 702/130 |
| 2007/0260735 A1 | 11/2007 | Olsson et al. | |

OTHER PUBLICATIONS

Helsinger, Aaron, et al., "Tools and Techniques for Performance Measurement of Large Distributed Multiagent Systems", AAMAS '03, Jul. 14-18, 2003, pp. 843-850.

Shudo, K, et al., "P3: P2P-based Middleware Enabling Transfer and Aggregation of Computational Resources", 2005 IEEE International Symposium on Cluster Computing and the Grid 2005, vol. 1, pp. 259-266.

Thomasian, A., et al., "Aggreation of Stations in Queueing Network Models of Multiprogrammed Computers", 1981, pp. 86-96.

Bay Networks. Using Optivity Network Management System 8.0 Internetwork Applications. California:Bay Networks, 1997.

University of North Florida—Information Technology Services. "ITS Customer Satisfaction Survey." 2003. University of North Florida. Oct. 4, 2004, http://www.unf.edu/~n00006282/cust_surv_/unf_its_survey.htm<.

* cited by examiner

COMPUTER SYSTEM PERFORMANCE ESTIMATOR AND LAYOUT CONFIGURATOR

CROSS-REFERENCE TO RELATED APPLICATION

This application cross-references related patent application Ser. No. 11/409,070 to Olsson et al., filed on Nov. 8, 2007.

I. FIELD OF THE INVENTION

This invention relates generally to a method and system for maximizing computational performance with respect to a computer system and, more specifically, to a method and system for measuring the performance of each computational unit within a computer system as it relates to environmental conditions proximate to the system and efficiently relocating individual computing units and/or re-allocating the computational activities when necessary to achieve optimal performance.

II. BACKGROUND OF THE INVENTION

A computer system is generally designed to ensure that its constituent components each operate within a specified temperature range within a predefined environment. However, in actual practice the environment in which the computers operate may not be able to sustain the temperature specification at all times. For instance, in a datacenter, the cooling air temperature and flow rates to each computer may vary spatially and temporally. Furthermore, the fluctuation in the environmental conditions will likely affect the operation of the computers.

Some conventional computer equipment already has power and thermal management capability. For example, the Central Processing Unit (CPU) typically has built-in temperature sensors. These built-in sensors monitor the operating temperature of the CPU and activate and control a throttling mechanism when the temperature of the CPU reaches a predefined threshold level. Once activated, the throttling mechanism lowers the computational activities of the CPU and, hence, its temperature. As a result, the CPU is placed in a computational state that reduces its computational performance.

A power and thermal management scheme such as the one mentioned above helps to maintain the temperature of the computer components to be within a given specified temperature range, however, this temperature stability comes at a cost. That is, by throttling the computational activities of the equipment, uncertainties in the overall computational performance of the overall computer system are introduced. It is desirable, therefore, to provide a method and corresponding tools for estimating the overall computational performance of a set of computer equipment with multiple computational units with respect 1) to the operating environment in which the computer equipment operates 2) the proximity of each computer equipment relative to each others Furthermore, because cooling air temperature and flow rates may vary within an operating environment, it is also desirable to provide a method and corresponding tools to guide the placement of computational units within the environment. For example, the computational units can be located such that the hottest units are located where the cooling air is the coolest or otherwise where the cooling air is used most efficiently.

U.S. Pat. No. 6,959,265 discloses user-centric measurement of quality of service (QoS) in a computer network; with each workstation or information access point (IAP) having installed thereon a QoS module for monitoring the IAP's performance. Because the QoS indices are time normalized, they may be aggregated or compared across the network by an IT administrator. The disclosure of the '265 patent provides a diagnostic tool for monitoring and analyzing the performance of applications on various workstations; with an aggregated number of threads and aggregated number of handles launched by an application in question. Further, the system disclosed in the '265 patent is able to display various snapshots of the system performance with a view of events, response time, resource usage, etc.

U.S. Published Application No. 20050027727-A1 discloses distributed data gathering and aggregation agent; with aggregation of operational metrics, e.g., performance metrics, process events, health monitor state, server state, for a plurality of members as a single entry and for a plurality of entities as a singular entity. As disclosed, a computer may operate in a networked environment using logical connections to one or more other, remote, computers, such as a remote client computer. At least one of the remote computers may be a workstation, a server computer, a router, a peer device or other common network node.

Systems and methods from related art do not include a system or method as set forth and claimed below. For example, none of the related art include a software tool for estimating the aggregated performance of a set of computers in a given cooling environment while providing the best location layout of each individual computer such that the highest overall performance can be achieved without changing the cooling environment. Further, related art systems do not include a software tool wherein the tool can also be used to estimate the aggregated performance for a given acoustic noise requirement or a tool that can also swap computational tasks between individual computers to ensure they are not constrained by the component temperatures, and be able to distribute the workload in such as way that the an overall optimized balance of computing unit temperature and performance is achieved. Further, none of the related art systems or methods includes a software tool that is able to display a dashboard which shows the temperature and performance of each individual computing unit as well as the overall system as a whole and, further, provides alerts proactively on components with low level of performance and critically high operating temperature.

III. SUMMARY OF THE INVENTION

According to an exemplary embodiment, the present invention provides a method for optimizing an overall performance of a computing system located within a given environment. A computing system in accordance with this embodiment comprises at least one computing unit and a method in accordance with the embodiment comprises querying each of the at least one computing units for data, wherein the data comprises at least temperature data corresponding to at least one sub-unit of each computing unit, determining an overall performance value indicative of the relative performance of the computing system, wherein the overall performance value is based on weighted performance indices of each of the at least one computing unit, and receiving location data indicative of the relative locations of each of the at least one computing unit within the given environment.

According to a further exemplary embodiment in accordance with the present invention a computer system is provided that comprises at least one computing unit located within a given environment, each computing unit comprising at least one sub-unit and a server operatively connected to each of the computing units, wherein the server is operable to receive location data, performance data. temperature data, other related data from each of the computing units and further operable to determine an ideal location for each of the computing units based on the location data, performance data, temperature data, and other related data received from each computing unit.

According to an even further embodiment, a computer program product for maximizing computational performance of a computer system that comprises at least one computing unit located within a given location is provided, the computer program product comprising a computer readable medium, first program instruction means for querying each of the at least one computing unit for data, wherein the data comprises at least temperature data corresponding to at least one sub-unit of each computing unit, second program instruction means for determining an overall performance value indicative of a relative performance of the computing system, wherein the overall performance value is based on weighted performance indices of each of the at least one computing unit, and third program instruction means for receiving location data indicative of the relative locations of each of the at least one computing units within the given environment.

According to an even further embodiment, a computer program product is for estimating the overall computational performance of a computer system that comprises at least one computing unit located within a given location and environmental condition. The computer program product also monitors and reports the health status of major components in those computing units and controls their performance states and computational activities in accordance with their respective operating conditions such as their operating temperatures in real time.

According to an even further embodiment, a computer program product for maximizing computational performance of a computer system that comprises at least one computing unit located within a given location is provided and used based on a given set of environmental conditions such as the cooling capacity of the location, the acoustic requirement, the total energy consumption of the system, etc.

Given the following enabling description of the drawings, the apparatus should become evident to a person of ordinary skill in the art.

IV. BRIEF DESCRIPTION OF THE DRAWINGS

The present invention is described with reference to the accompanying drawings, wherein:

FIG. 1 is a block diagram illustration of a computing unit monitor and control system in accordance with the present invention;

FIG. 2. is a block diagram illustration of a CPU monitor and control system in accordance with the present invention;

V. DETAILED DESCRIPTION OF THE DRAWINGS

Figure 1:
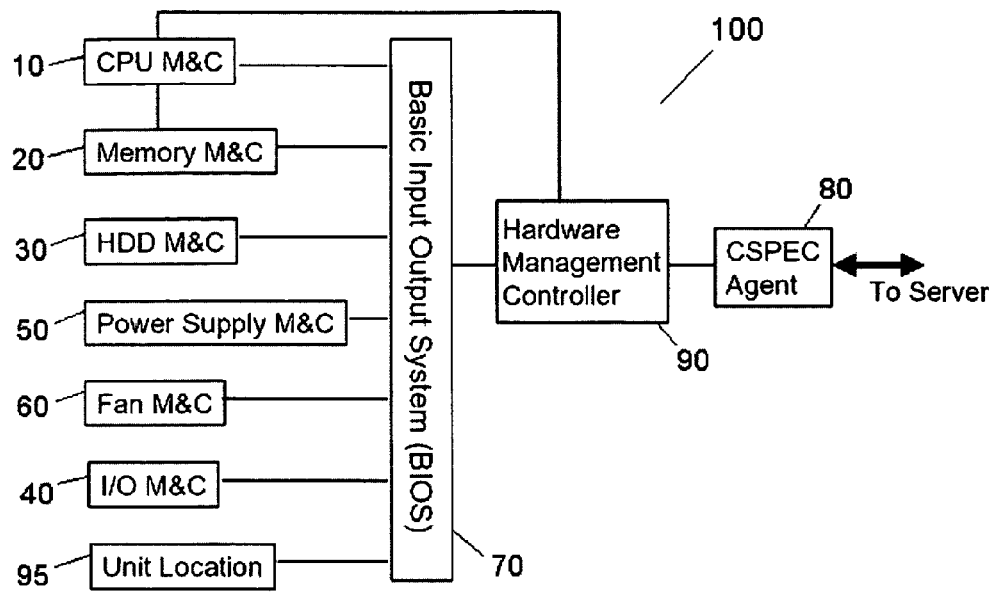

Referring to the figures, FIG. 1 is a block diagram of a monitor and control system 100 of a computing unit according to one exemplary embodiment of the present invention. As shown, FIG. 1 includes a central processing unit (CPU) monitor and control (M&C) portion 10 corresponding to one or more CPU devices (not shown), a memory device monitor and control (M&C) portion 20, a hard disk drive monitor and control (M&C) portion 30 corresponding to one or more hard disk drives (HDD), an I/O chip monitor and control (M&C) portion 40, corresponding to one or more I/O chips, such as graphics chips, a power supply monitor and control (M&C) portion 50 for any power supplies, and a cooling fan monitor and control (M&C) portion 60 for any cooling fans or blowers.

Basic input output system (BIOS) 70 is a set of software routines that are stored, for example, in a nonvolatile memory device (not shown), and used to place the computing unit in an ordered state at power-on or after a reset condition has occurred, e.g., before the operating system (OS) is loaded. BIOS 70 is also used as a bridge for higher levels of software to communicate commands and instructions to and from each of the components in the computing unit. Those skilled in the art will understand the various typical operations of BIOS 70 and, thus, further discussion regarding conventional operations of BIOS software is beyond the scope of discussion here.

Each computing unit in accordance with the present embodiment comprises a software set called CSPEC Agent 80, which runs subsequent to the operating system (OS) being loaded. CSPEC Agent 80 communicates with the Hardware Management Controller (HMC) 90 which in turn communicates either directly or through the BIOS 70 to each M&C portion of system 100. For example, according to one aspect of the present embodiment, HMC 90 communicates with CPU M&C portion 10 and memory M&C portion 20 directly or through the BIOS 70.

In accordance with a further embodiment, to identify the location of a particular computing unit, specific location-identifying code 95 is read through the BIOS 70 and sent to the CSPEC Agent 80. One method of providing the location-specific code includes providing a connector with hard-wired combinations built in the chassis or rack in the location into which a computing unit is to be plugged or otherwise inserted. For example, a specific pin combination, or address, within the chassis connector specifically identifies a specific location within a given environment, e.g., room, etc. When a computing unit is plugged into the chassis in this location, a matched connector on the computing unit mates with the connector in the chassis and the BIOS in the computing unit reads and registers the built-in location code, e.g., address, resident in the pins of the chassis connector. The protocol of reading the location code in this example can be any serial communication scheme commonly used in the industry such as Inter-Integrated Circuit (I²C) bus protocol.

Figure 2:
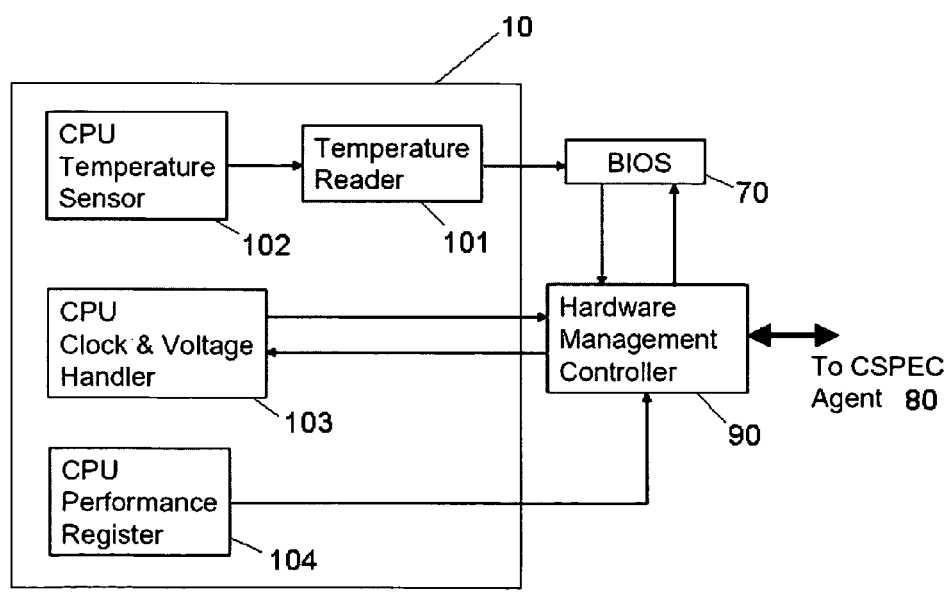

FIG. 2 is a detailed block diagram of a CPU monitor and control module 10 in accordance with the present invention. In accordance with this embodiment, HMC 90 requests and receives temperature readings from temperature reader 101 which, in turn, obtains the temperature readings from a CPU temperature sensor 102. HMC 90 requests the readings from temperature reader 101 through BIOS 70. HMC 90 also sets the CPU clock frequency and power supply voltages on the CPU clock and voltage handler 103 based on instructions from the CSPEC Agent 80. HMC 90 is further operable to initialize and control CPU performance register 104. CPU performance register 104, once initialized, determines the duration of the event which indicates a level of performance for the CPU for a particular combination of clock frequency and voltages. The CPU performance register 104 is generally initialized at power-on and then later the request of the HMC 90 before starting an event counting. The duration of an event in terms of the number of clock cycles will be stored in the register 104, which will be read through the HMC 90 and sent to CSPEC 80 for further processing.

Figure 3:
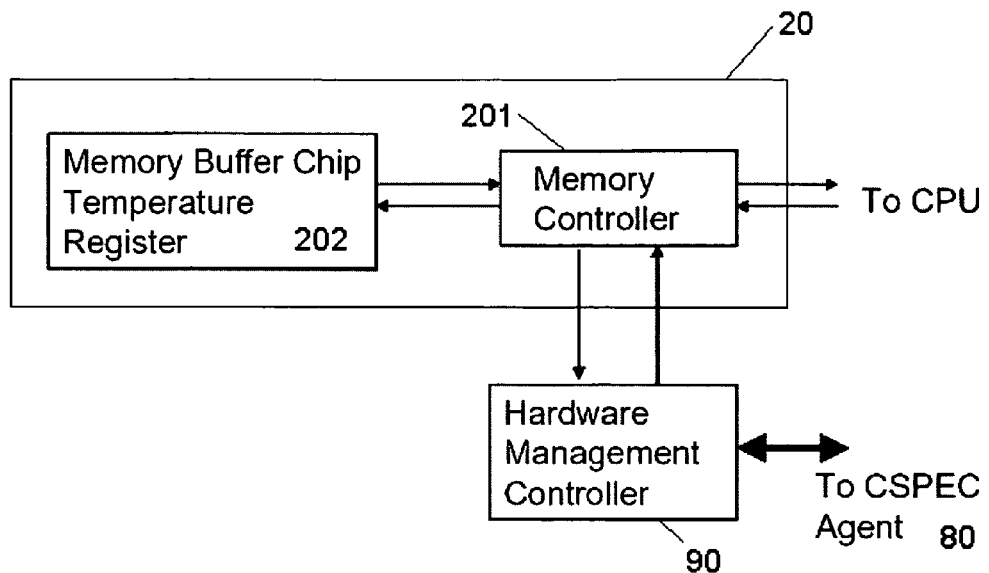
FIG. 3 is a block diagram illustration of a memory device monitor and control system in accordance with the present invention.

FIG. 3 is a block diagram of a memory device monitor and control module 20 in accordance with the invention. According to this embodiment, HMC 90 communicates with the memory controller 201 which in turn communicates with the memory buffer chips in the memory cards. In particular, memory controller 201 communicates with a temperature register portion 202 of the memory buffer chip. Internal circuitry (not shown) in the memory buffer chip reads its built-in temperature sensor on the chip and places the reading in the on-chip register 202. The communication between memory controller 201 and the register 202 is generally through System Management Bus (SMB) which is an industry standard communication protocol. To read the content in the temperature register portion 22, CSPEC will send a command to the memory controller 201 through the HMC 90 via the SMB. The memory controller 201 is then read the content from the temperature register portion 22.

Figure 4:
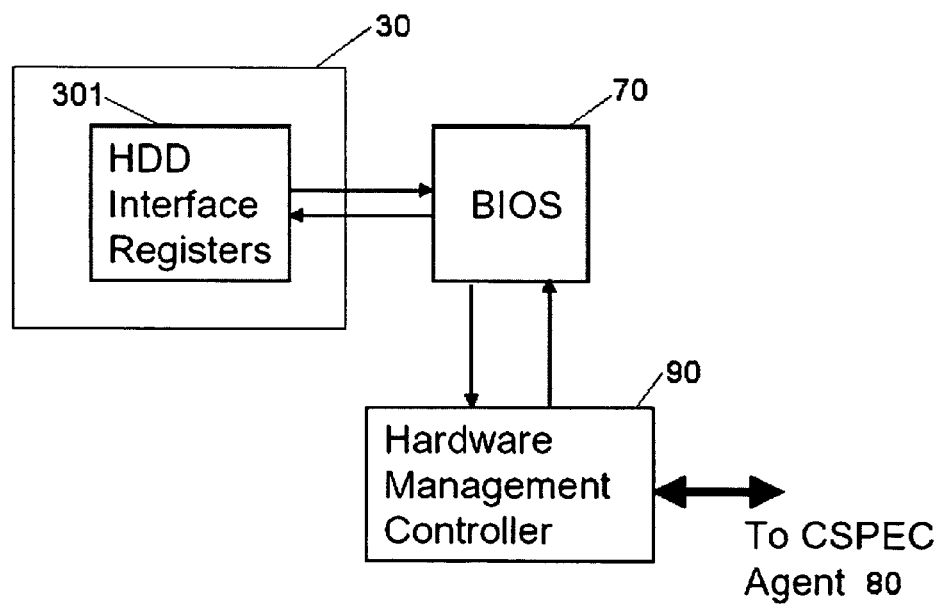
FIG. 4 is a block diagram illustration of a hard disk drive monitor and control system in accordance with the present invention.

FIG. 4 is a block diagram of a hard disk drive monitor and control module 30. With respect to this portion of the present embodiment, HMC 90 communicates to the hard disk drive (HDD) via BIOS 70. Circuitry within the hard disk drive reads an internal temperature sensor (not shown) of the HDD and places the temperature reading into an interface register 301.

Figure 5:
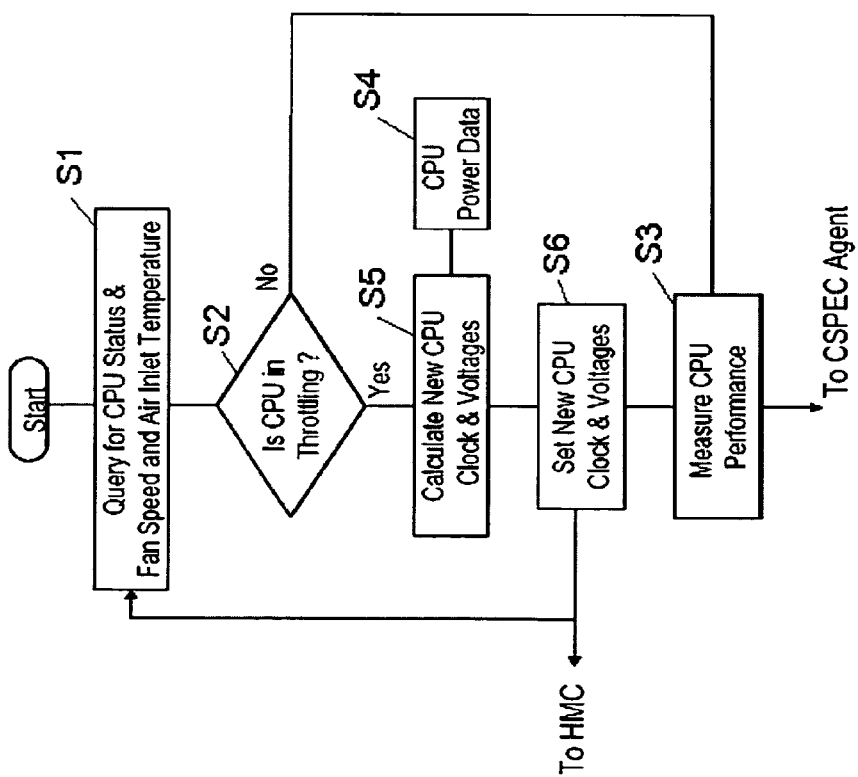
FIG. 5 is a flow chart illustration of a CSPEC CPU sub-agent in accordance with the present invention.

FIG. 5 is an exemplary flow chart illustrating the actions of the CSPEC CPU sub-agent according to one exemplary embodiment of the invention. In particular, the CSPEC CPU sub-agent comprises a software routine running under the CSPEC agent in each computing unit according to the invention. In this figure, the software routine that relates to the CPU part of the monitor and control is illustrated. Similar software routines for other components such as memory, hard drives, etc. will also be run under the CSPEC agent.

As shown in FIG. 5, at start, the CSPEC CPU sub-agent routine queries the CPU for its status, the fan speed and the air inlet temperature of the computing unit (S1). The routine then determines whether the CPU has already been placed into a throttling state (S2), which, in general, can be read from a specific register in the CPU. If the CPU of the computing unit is not in a throttling state, the CSPEC CPU sub-agent routine proceeds to measuring a performance condition of the CPU (S3). Alternatively, if the CPU is in a throttling state, the routine will check its temperature, the fan speed, and the air inlet temperature. Using these data, the routine then searches the CPU power data (S4) and calculates a new set of CPU clock and voltages that will most likely match the cooling environment such that the CPU will run without throttling. The information of the new set of CPU clock and voltages will send to HMC 90 for implementation. This routine will repeat until the CPU runs in the normal (non-throttling) state. Sometimes, a time delay may be needed to let the CPU temperature to settle after each setting of clock and voltages. For the clarity of explanation, this time delay is not depicted explicitly in the figure. Alternatively, the CPU will generate an over temperature event and warning indicating an unacceptably high value and initiating a voltage and clock frequency reduction events to reduce CPU power, hence its temperature. For example, the following CPU states could be evidenced:

```
Start
  CPU Frequency, CPU Voltage, Associated CPU Power
  4.0 GHz, 1.4 V, 100 W
  Reduce Voltage
  1.4 V --> 1.3 V
  Reduce Frequency
  4.0 GHz --> 3.8 GHz
  Associated CPU Power 82 W
  Over Temp Alert Gone, If Not
  Reduce Voltage
  1.3 V --> 1.2 V
  Reduce Frequency
  3.8 GHz --> 3.6 GHz
  Associated CPU Power 68 W
```

As can be seen in the example, several steps are needed to gradually lower the CPU power. As a final safeguard, if the CPU temperature is still higher than the specified temperature, a signal is sent to the CSPEC to move the computational activities to other computing units in the system. A warning flag will also be displayed in the dashboard about this situation.

In an opposite scenario, if the actual power consumption of a CPU and the inlet air temperature are lower than that which is specified or the fan speed (the air flow as a consequence) is higher than specified, the CPU temperature may be lower than specified with the same level of computational activities, the CPU, in general, can be run at a set of clock frequency and voltages higher than the specified. This routine can be extended to cover this scenario.

Figure 6:
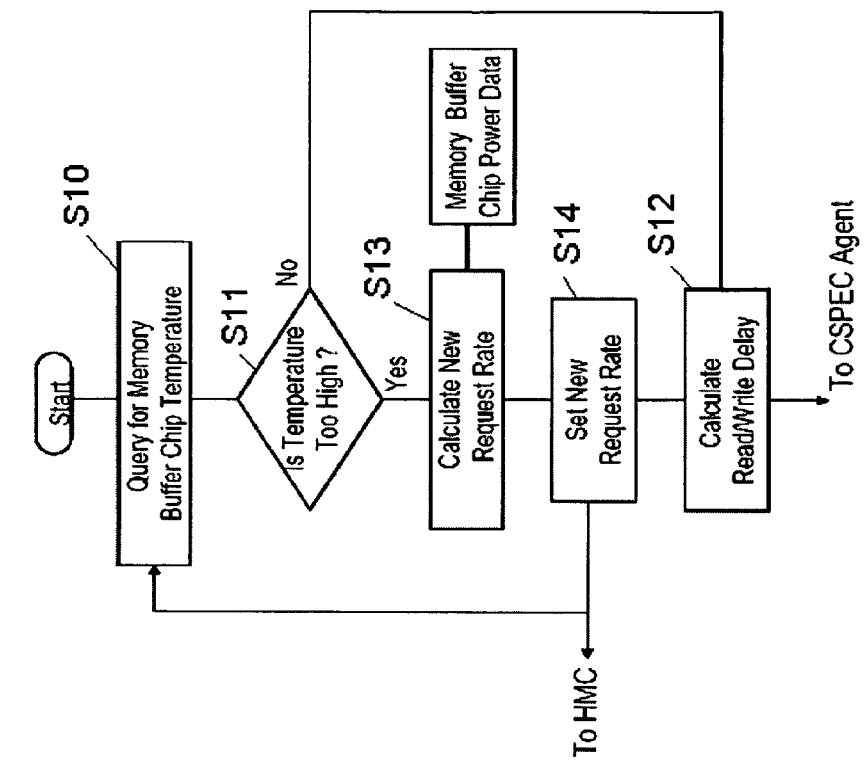
FIG. 6 is a flow chart illustration of a CSPEC memory device sub-agent in accordance with the present invention.

FIG. 6 is an exemplary flow chart illustrating the actions of the CSPEC memory sub-agent according to one exemplary embodiment of the invention. In particular, the CSPEC memory sub-agent comprises a software routine running under the CSPEC agent in each computing unit according to the invention.

As shown in FIG. 6, at start, the CSPEC memory routine queries the memory device for the temperatures of, for example, each memory buffer chip on each memory card (S10). After the temperature readings are obtained, the CSPEC memory routine compares each of the temperatures to respective predefined threshold temperatures (S11). If the obtained temperature is below the respective threshold temperature, for example it is determined that the temperature is not too high, the routine performs a read process that reads a read/write delay value and then exits the routine (S12). Alternatively, if the obtained temperature value is higher than the specified threshold temperature, that is, the temperature of the buffer chip is too high, the routine calculates a revised read/write request rate using predefined memory buffer chip power data (S13), in which a table for the relationship of the memory buffer chip temperature and the read/write request rate is listed. This table is obtained from actual measurement or from manufacturer's specification if available. In general, a relatively fast read/write request rate will make the memory chips and the memory buffer chip itself consume more power and, hence, create higher chip temperatures. The routine uses this table to calculate the next available read/write request rate by interpolation such that the temperature of the memory buffer chip as well as the memory chips will most likely be lower than the specified value. The revised calculated read/write request rate is then set and sent to the HMC 90 which, in turn, instructs the memory buffer chips accordingly (S14).

Figure 7:
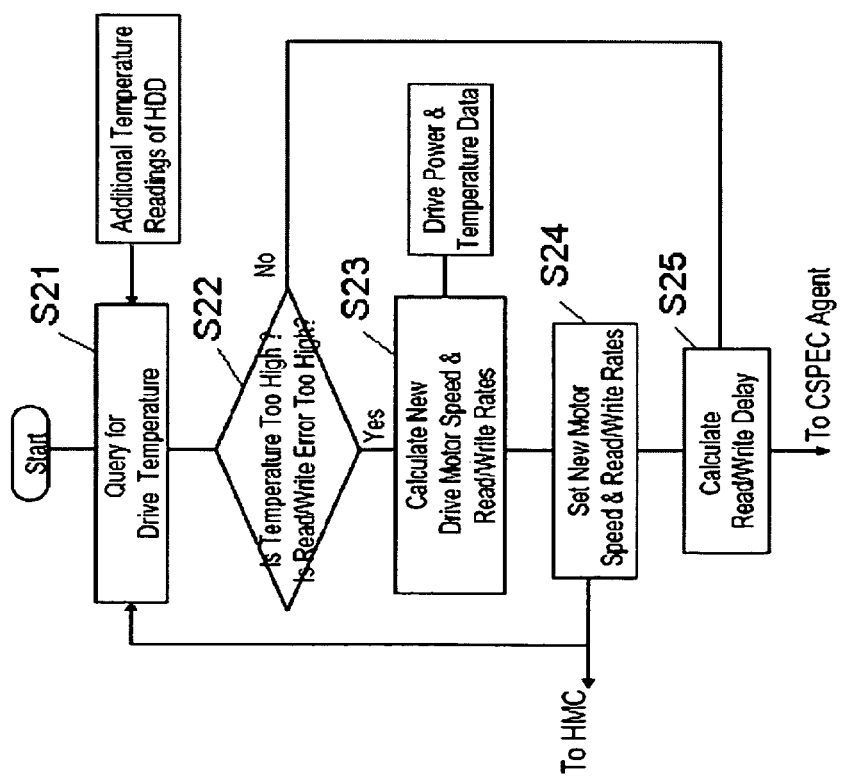
FIG. 7 is a flow chart illustration of a CSPEC hard disk drive sub-agent in accordance with the present invention.

FIG. 7 is an exemplary flow chart illustrating the actions of the CSPEC hard disk drive sub-agent according to one exemplary embodiment of the invention. In particular, the CSPEC hard disk drive sub-agent comprises a software routine running under the CSPEC agent in each computing unit. As shown in FIG. 7, at start, the CSPEC hard disk drive sub-agent routine queries the HDD for an internal temperature reading of the drive as well as other temperature readings (S21). For example, if available, the other temperature readings include one or more of the temperature outside the HDD and the temperature on the cover of the drive. Once the temperature readings of the drives, etc., have been obtained, the routine determines whether these temperatures are too high and/or whether the read/write error rate is too high (S22).

If the temperature and and/or error rates are within acceptable range, no action is taken and the agent continues to monitor the drive. If the temperatures and/or error rates are too high, e.g., either one is higher than a respective predefined value; the routine performs further diagnostic checks on the health of the drive in general. If the drive is healthy otherwise, the routine will calculate a revised set of motor speed and read/write rates based on the power and temperature data of the drive (S23). If the drive is not healthy such as the motor speed is not in the preset range, a warning signal will be sent to the CSPEC agent (S25) as well. This revised set of parameters is then set and sent to the HMC 90 for placing the drive into a new state that will use less power and generate less heat (S24). Once the revised set of read/write request rates are settled, the routine will estimate the read/write delays and calculate the drive performance index which is to be sent to the CSPEC agent (S25).

Figure 8:
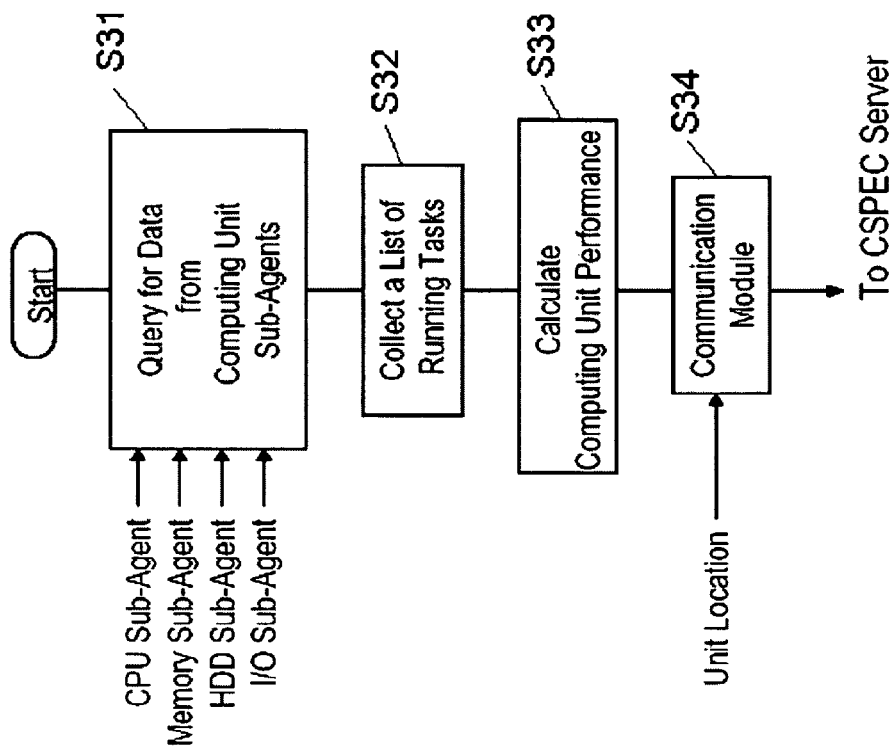
FIG. 8 is a flow chart illustration of a CSPEC agent in accordance with the present invention.

FIG. 8 is an exemplary flow chart illustrating the actions of the CSPEC agent according to one exemplary embodiment of the invention. In particular, the CSPEC agent in accordance with this embodiment comprises a software routine that runs in each computing unit after the operating system (OS) is loaded.

As shown in FIG. 8, the CSPEC agent (80 in FIG. 1) queries each sub-agent for its respective data (S31). These sub-agents comprise all of the sub-agents running in the computing unit, for example, the sub-agents shown in FIG. 1, i.e., CPU, memory, HDD, I/O, power supply and cooling. The CSPEC agent also collects a list of the running tasks including CPU and memory usage from the operating system (S32). Further, the CSPEC agent calculates a performance index value with respect to the computing unit to indicate its performance state (S33). A high index value is normally assigned to indicate that the computing unit is approaching its peak performance state, while a small value is assigned for low performance state. This performance index can be derived from all individual indices of the running tasks and of the sub-agents. For example, the performance index is computed as the sum of the weighted performance indices of all running tasks determined by comparing the CPU and memory usages of the running tasks with a set of stored benchmarking task results. The weighted performance index along with the location information of the computing unit is then sent, via a communication module, to the CSPEC server, which is running in a separate computing unit (S34).

Figure 9:
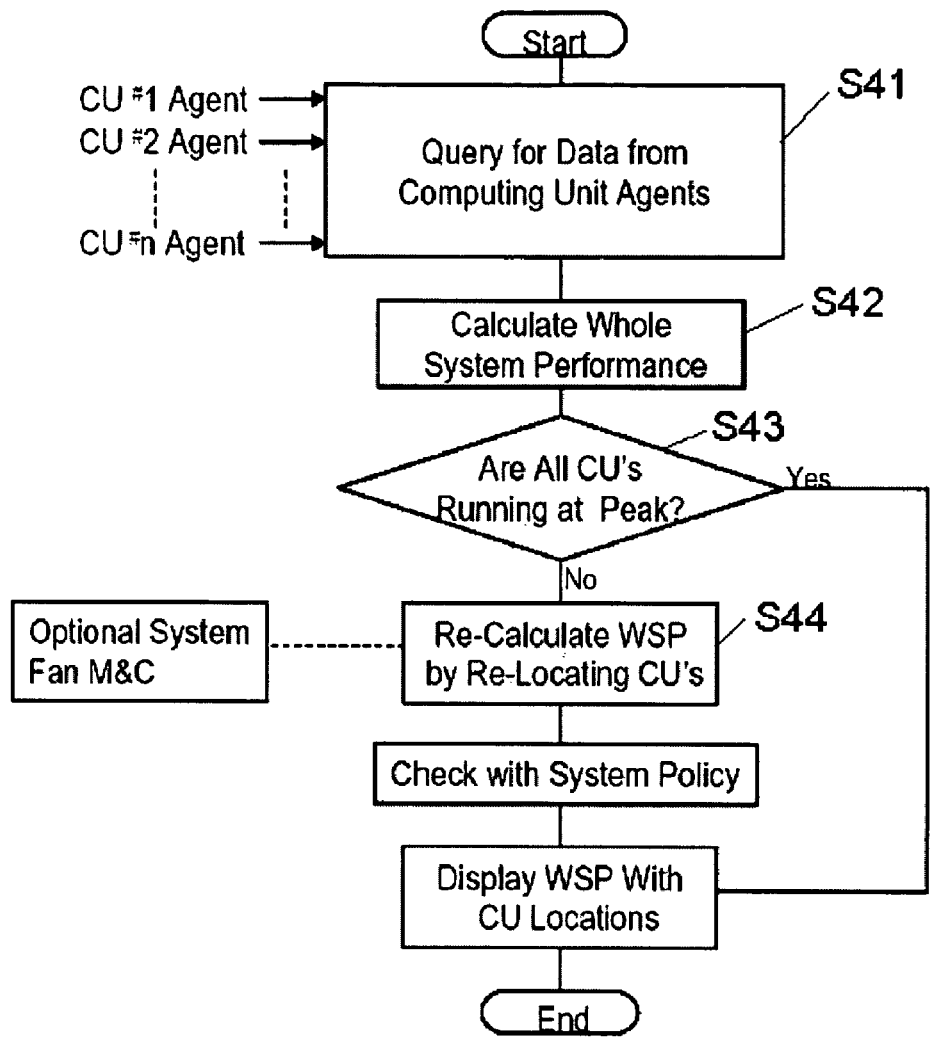
FIG. 9 is a flow chart illustration of a CSPEC server in accordance with the present invention.

FIG. 9 is an exemplary flow chart illustrating the actions of the CSPEC server tool, namely the configuration. In particular, the CSPEC server tool in accordance with this embodiment comprises a software routine that runs in a separate computing unit designated as a server in a system composed of multiple computing units (CUs).

As shown in FIG. 9, the CSPEC server collects inputs from each of the CSPEC sub-agents running in the computing units, e.g., CU #1 through CU #n, (S41). The server then calculates a performance value for the entire computing system based on the weighted performance indices of each of the computing units (S42). Additionally, the server checks if all of the components within the computing units are running at their peak performance state (S43). If any of the components within the computing units is not running at peak performance, the server examines the records received from each of these computing units, one by one, to find out the cause of the non-peak performance condition. For example, the CPU in CU #1 is in a throttling state (a non-peak performance condition) and the air inlet temperature in that unit is higher than a predefined value, the server will record the corresponding component name, location, performance state, and the causes in a database. Similar procedure will carry for all components that are reported not running in the peak performance state.

If a component determined not to be running at peak performance otherwise seems healthy, the server operates in accordance with the algorithm outlined below to determine a new location for the computing unit with this otherwise healthy component (S44). The new location is chosen such that the computing unit now runs in its peak performance state.

The algorithm for determining a new location for the CU is as follows:

(1) Search for a location in the environment that has a lower air inlet temperature;

(2) Retrieve the correlation data between the air inlet and component temperatures from a database, e.g., prepared by the computing unit manufacturer;

(3) Calculate the component temperature for the potential location;

(4) If the calculated component temperature allows the computing unit to perform at the peak performance state, go to (5), otherwise repeat (1) to (3) for another location with an even lower air inlet temperature;

(5) Repeat (1) to (4) for all other computing units until all computing units can run at the peak state. If this can not be achieved, count how many computing units are not able to run at the peak state;

(6) Check with the system policy provided by the manufacturer to see if relocation of this computing unit is allowed;

(7) If allowed and the system cooling environment can be changed such as increasing the system fan speed, calculate a revised system fan speed to allow all of the computing units running at the peak state;

(8) Provide recommendation with detailed layouts to the system planner.

The purpose of the above exemplary algorithm is to achieve the highest possible overall system performance based on a given system cooling environment which may vary spatially and temporarily. A skilled artisan would understand that the above algorithm can be modified to achieve other objectives. For example, the algorithm may be modified for determining the overall system performance for a given acoustic noise requirement. In this embodiment, the correlation between acoustic noises and air inlet temperatures is needed and should be provided by the manufacturer. This correlation can now be used in conjunction with the above algorithm to calculate the overall system performance based on the acoustic noise requirement. Moreover, the algorithm may be modified for determining the overall system performance for a given total energy consumption requirement at a particular time slot in a day. In this embodiment, the correlation between the energy consumption and performance indices of individual computational unit will be provided and can now be used in conjunction with the above algorithm to calculate the overall system performance based on the total energy consumption requirement.

After the physical location of each computing unit is rearranged, if it is determined that there are still some units running in a less-than-peak performance state due to the temperature constraints, the CSPEC server tool checks the computational load of these units. If the load in these units is also high, the CSPEC server tool searches a database for the correlation of computational load and unit component temperatures. If a computing unit that can run the same computational load with lower unit component temperatures is found, the server performs a swap of the computational tasks running between these two units. The aggregated system performance is therefore ensured with this additional load swapping.

According to an even further embodiment, the CSPEC displays a dashboard on real-time temperature and performance of the system, and provides monitoring and visual alerts on components with low performance and critical temperature. The system administrator acts on alerts to retrieve more detailed information and historical data for the component. Suggested solutions and action capability can also be provided for the administrator to perform manual swapping of the computational loads among components in order to achieve better performance.

The embodiments described are exemplary and are not meant to limit the scope of the invention. The environmental data include but not limited to the air inlet and outlet temperatures, air or other coolant flow rates, altitude of the location, humidity, etc. The data inputs to the embodiment described include but not limited to the component temperatures, performance value, data read/write rates, fan speed, clock frequencies, voltages, power consumption of the components as well as the computing units, etc. Those skilled in the art will understand that the invention can take forms other than those specifically described in regard to the above embodiments. For example, the invention can take the form of an entirely hardware embodiment, an entirely software embodiment or an embodiment containing both hardware and software elements. In one exemplary embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

It would be understood that a method incorporating any combination of the details mentioned above would fall within the scope of the present invention as determined based upon the claims below and any equivalents thereof.

Other aspects, objects and advantages of the present invention can be obtained from a study of the drawings, the disclosure and the appended claims.

We claim:

1. A method for optimizing an overall performance of a computing system located within a given environment, the computing system comprising at least one computing unit, the method comprising:
   querying each of the at least one computing units for data, wherein the data comprises at least temperature data corresponding to at least one sub-unit of each computing unit;
   determining an overall performance value indicative of the relative performance of the computing system, wherein the overall performance value is based on weighted performance indices of each of the at least one computing units;
   receiving location data indicative of the relative locations of each of the at least one computing units within the given environment;
   querying each sub-unit of each computing unit for respective sub-unit data, wherein the sub-unit data includes temperature data and a list of running tasks performed by the sub-unit;
   calculating a respective performance value for each of the at least one computing units, wherein each respective performance value includes a weighted performance index based on a comparison of said list of running tasks with a benchmark, wherein said calculating of said respective performance value includes comparing central processing unit and memory usages of said running tasks with said benchmark; and
   calculating a revised location within the given environment for at least one of the computing units, wherein the revised locations are based on the received location data and the temperature data.

2. The method of claim 1, further comprising:
   determining whether all of the at least one sub-units are running at peak performance;
   determining at least one cause for any sub-units that are not running at peak performance.

3. The method of claim 2, wherein the at least one cause comprises at least one of air inlet temperature, component health status, power consumption and computational load.

4. The method of claim 1, wherein the location data indicative of the relative locations of each of the at least one computing units within the given environment comprises unique data words received from each computing unit and wherein each unique data word uniquely identifies a respective location within the given environment.

5. The method of claim 1, further comprising:
receiving temperature data from a hard disk drive sub-unit of a computing unit, wherein the temperature data from the hard disk drive sub-unit is indicative of at least one of an internal temperature of the hard disk drive sub-unit, the temperature outside the hard disk drive sub-unit and the temperature on the cover of the hard disk drive sub-unit;
determining at least one of whether any of the hard disk drive sub-unit temperatures exceed a predetermined threshold and whether an error rate associated with the hard disk drive sub-unit exceeds another predetermined threshold; and
calculating at least one of a revised motor speed and a revised desired error rate associated with the hard disk drive sub-unit based on the temperature data received from the hard disk drive sub-unit.

6. The method of claim 1, further comprising:
receiving temperature data from a memory device sub-unit of a computing unit, wherein the temperature data from the memory device sub-unit is indicative of a temperature of the memory device sub-unit;
determining whether the temperature data received from the memory device sub-unit exceeds a predetermined threshold; and
if the temperature data received from the memory device sub-unit exceeds a predetermined threshold, calculating an updated read/write request rate.

7. The method of claim 1, further comprising:
receiving data from a processor sub-unit of the computing unit, wherein the data from the processor sub-unit comprises at least one of status data corresponding to the processor sub-unit, a fan speed and an air inlet temperature corresponding to the processor sub-unit;
determining whether the processor sub-unit is in a throttling condition.

8. The method of claim 7, further comprising measuring a performance condition of the processor sub-unit.

9. The method of claim 7, further comprising:
determining an amount of power drawn by the processor sub-unit; and
comparing the determined amount of power drawn by the processor sub-unit to a predefined threshold.

10. The method of claim 9, further comprising:
calculating a revised clock frequency for the processor sub-unit;
calculating a revised supply voltage for the processor sub-unit; and
sending the revised clock frequency and revised supply voltage to a hardware management controller.

11. The method of claim 1, further comprising displaying the performance value and temperature data associated with at least one of the computing units.

12. The method of claim 1, further comprising reallocating at least one task performed by at least one sub-unit of a first computing unit to a respective sub-unit of a second computing unit, wherein said reallocation is based at least partially on temperature data associated with the first and second computing units.

13. A computer system comprising:
at least one computing unit located within a given environment, each computing unit comprising at least one sub-unit;
a server operatively connected to each of said computing units, wherein said server is operable to receive location data, performance data and temperature data from each of said computing units and further operable to determine an ideal location for each of said computing units based on the location data, performance data and temperature data received from each computing unit;
means for querying each sub-unit of each computing unit for respective sub-unit data, wherein the sub-unit data includes temperature data and a list of running tasks performed by the sub-unit;
means for calculating a respective performance value for each of the at least one computing units, wherein each respective performance value includes a weighted performance index based on a comparison of said list of running tasks with a benchmark, wherein said calculating of said respective performance value includes comparing central processing unit and memory usages of said running tasks with said benchmark; and
means for determining an overall performance value indicative of a relative performance of the computer system, wherein the overall performance value is based on weighted performance indices of each of the at least one computing units.

14. The computer system claimed in claim 13, further comprising:
means for querying each of the at least one computing units for the location data, performance data and temperature data; and
means for receiving location data indicative of the relative locations of each of the at least one computing units within the given environment.

15. A computer program product for maximizing computational performance of a computer system comprised of at least one computing unit located within a given location, the computer program product comprising:
a computer readable medium;
first program instruction means for querying each of the at least one computing units for data, wherein the data comprises at least temperature data corresponding to at least one sub-unit of each computing unit;
second program instruction means for determining an overall performance value indicative of a relative performance of the computing system, wherein the overall performance value is based on weighted performance indices of each of the at least one computing units;
third program instruction means for receiving location data indicative of the relative locations of each of the at least one computing units within the given environment;
fourth program instruction means for querying each sub-unit of each computing unit for respective sub-unit data, wherein the sub-unit data includes temperature data and a list of running tasks performed by the sub-unit;
fifth program instruction means for calculating a respective performance value for each of the at least one computing units, wherein each respective performance value includes a weighted performance index based on a comparison of said list of running tasks with a benchmark, wherein said calculating of said respective performance value includes comparing central processing unit and memory usages of said running tasks with said benchmark; and
sixth program instruction means for determining whether all of the at least one sub-units are running at peak performance.

16. The computer program product of claim 15, further comprising:
seventh program instruction means for determining at least one cause for any subunits that are not running at peak performance.

* * * * *